(12) United States Patent
Lin et al.

(10) Patent No.: US 6,423,141 B1
(45) Date of Patent: Jul. 23, 2002

(54) METHOD AND APPARATUS FOR DISPENSING VISCOUS MATERIAL

(75) Inventors: Jeff Lin, Canton; John Trublowski, Troy; Vinh Van Ha, Southfield, all of MI (US)

(73) Assignee: Visteon Global Tech., Inc., Dearborn, MI (US)

( * ) Notice: Subject to any disclaimer, the term of this patent is extended or adjusted under 35 U.S.C. 154(b) by 0 days.

(21) Appl. No.: 09/358,980

(22) Filed: Jul. 22, 1999

Related U.S. Application Data (63) Continuation-in-part of application No. 08/716,037, filed on Sep. 19, 1996, now abandoned, which is a continuation of application No. 08/363,806, filed on Dec. 27, 1994, now abandoned.

(51) Int. Cl.$^7$ ................................................. B05C 3/02
(52) U.S. Cl. ........................................................ 118/413
(58) Field of Search .................... 118/406, 413, 118/410, 415; 222/350, 380; 101/123, 120, 124, 119, 129, 167, 169; 427/282, 356

(56) References Cited

U.S. PATENT DOCUMENTS

| | | | |
|---|---|---|---|
| 4,622,239 A | | 11/1986 | Schoenthaler et al. |
| 4,720,402 A | | 1/1988 | Wojcik |
| 4,848,606 A | * | 7/1989 | Taguchi et al. |
| 5,133,120 A | | 7/1992 | Kawakami et al. |
| 5,183,508 A | * | 2/1993 | Cholinski |
| 5,191,709 A | | 3/1993 | Kawakami et al. |
| 5,733,597 A | * | 3/1998 | Schmitkons et al. |

* cited by examiner

*Primary Examiner*—Brenda A. Lamb
(74) *Attorney, Agent, or Firm*—Visteon Global Tech., Inc.

(57) ABSTRACT

A novel apparatus for compressing viscous material through openings in a stencil is disclosed. The novel apparatus has a compression head cap which provides a contained environment to direct and to aid the flow of pressurized viscous material through the openings in the stencil. The compression head cap further includes a plurality of members which are selectively and movably disposed within the contained environment and which selectively remove an amount of the material from the environment, effective to prevent the material from being undesirably dispensed by the head cap.

1 Claim, 7 Drawing Sheets

METHOD AND APPARATUS FOR DISPENSING VISCOUS MATERIAL

This application is a continuation in part from U.S. patent application Ser. No. 08/716,037 (filed Sep. 19, 1996), now abandoned which is a continuation of U.S. patent application Ser. No. 08/363,806 (filed Dec. 27, 1994, and now abandoned).

BACKGROUND OF THE INVENTION

1. Field of the Invention

Embodiments of the present invention relate generally to methods and devices for depositing viscous materials onto a printed wiring board. In one aspect, the present invention relates to methods and devices for compressing viscous materials, such as solder paste, through openings in a perforated substrate, such as a patterned screen or stencil.

2. Description of Related Art

Surface Mount Technology (SMT) involves placing circuit components onto circuit paths embedded on the upper surface of a printed wiring board and then soldering the components in place by a process called "reflow soldering". Before the circuit component is placed on the printed wiring board, however, it is desirable to apply solder paste to the area on the printed wiring board where the component is to be soldered into place.

Conventional methods do exist to deposit ("print") solder paste onto desired areas of a printed wiring board by forcing the paste through openings in a substrate (e.g., a stencil) placed in intimate contact with the printed wiring board.

U.S. Pat. No. 4,622,239 describes such a method and device for dispensing viscous materials. The method includes forcing a viscous material from a housing through an opening and depositing it onto a stencil between a pair of flexible members (parallel squeegee blades) which depend from the housing on either side of the opening and are in contact with the stencil. The ends of the flexible members are not connected and remain open ended. The viscous material, accordingly, is not contained within an enclosed area when it is deposited on the surface of the stencil. Movement of the housing and the flexible members horizontally across the stencil causes the trailing flexible member to force the viscous material through the openings in the stencil. U.S. Pat. No. 4,720,402 describes a similar method and device except that the leading flexible member is raised off of the stencil during movement of the housing.

U.S. Pat. Nos. 5,133,120 and 5,191,709 describe methods for filling through-holes of a printed wiring board via a mask with pressurized conductive filler material by means of a nozzle assembly unit having a nozzle tip member. The nozzle tip member, however, is designed only to dispense the pressurized conductive filler material through the mask to a single through-hole. The nozzle tip member then "scans" the printed wiring board for a second through-hole to fill. The nozzle tip member has a blunt end section which rests on the mask and a circular exit, the diameter of which may be increased or decreased by changing the nozzle tip member. The nozzle tip member dispenses the filler material without controlling unwanted flow of "excessive" filler material back through the stencil. Additionally, the nozzle tip member does not define a contained environment where "compression" of the filler material takes place through the mask followed by the immediate shearing off of the filler material within that contained environment from the surface of the stencil. In fact, the nozzle tip member itself provides no effective means for shearing off filler material from the top of the stencil, rather, after the through hole is filled and filler material "backs up" through the stencil, the nozzle tip member moves forward whereupon the "excessive" filler material is then wiped off by a separate, single, flexible squeegee member which is designed for unidirectional use only.

Unfortunately, these conventional efforts do not provide a contained environment for compression of viscous material through holes in a stencil and shearing of viscous material within the contained environment from the upper surface of the stencil. Reliance upon squeegee movement to force the viscous material, such as solder paste, through the stencil openings can lead to damage and eventual failure of both the squeegee blades and the stencil due to repeated friction. Since conventional efforts do not provide a contained environment in which compression and shearing is accomplished, waste of the viscous material is frequently encountered.

Conventional efforts, therefore, (1) fail to maximize the efficiency of printing solder paste onto a desired area of a printed wiring board and (2) fail to minimize waste of the solder paste during the printing process. A need therefore exists to develop a method for printing solder paste onto a printed wiring board and a device suitable for use therewith which overcomes the previously delineated deficiencies of the conventional efforts.

These conventional methods which utilize a print compression head to deposit viscous material onto a printed wiring board suffer from several other drawbacks. For example, prior compression heads undesirably "leak" or emit material even after a print stroke is completed and material is no longer being received, due to the existence of residual or inertial pressure remaining within the compression head.

Moreover, oftentimes printing cannot desirably begin as soon as material begins to flow to the head assembly since the received material must first be pressurized and then operatively flow within the compression head assembly in order to allow substantially uniform and desired printing to occur. This "lag time" increases production time. Moreover, this "lag time" typically varies between printing cycles and is difficult to actually measure or determine without first operating the head in order to determine whether the assembly actually produces desirable printed circuits, thereby further increasing production time and causing the creation of defective circuits which undesirably increases production costs.

The present invention is therefore directed at solving these problems related to prior print compression heads. Particularly, the present invention substantially and selectively relieves the residual pressure within the compression head at the end of a print stroke, thereby substantially eliminating the undesired leakage of the contained material, and further allowing for printing to desirably begin relatively faster than is possible or practical with prior compression heads.

SUMMARY OF THE INVENTION

The present invention includes a novel apparatus and method for dispensing viscous material through openings in a stencil. Embodiments of the present invention include a process herein referred to as "compression printing" wherein pressure is applied to a viscous material within a contained environment defined by a compression head cap so as to compress it through openings in a stencil.

The apparatus of the present invention includes a reservoir containing viscous material which is operably connected to a pressure source. The reservoir is in fluid communication with a housing which terminates in a substantially uniform opening defined by a compression head cap formed from contiguous walls. During operation of the apparatus, the compression head cap is placed in contact with a stencil having a plurality of openings therein. The compression head cap and the stencil form a contained environment. The pressure source then applies pressure against the viscous material contained in the reservoir forcing it from the reservoir into the housing and to the compression head cap. The contiguous walls of the compression head cap act to contain and to direct flow of the pressurized viscous material to the top surface of the stencil and then through the openings in the stencil.

It is accordingly an object of the present invention to provide a novel apparatus for compressing a viscous material through openings in a stencil by means of a pressure source. It is a further object of the present invention to increase the efficiency of printing viscous material onto a desired area of a printed wiring board and to minimize waste of the viscous material during the printing process.

According to another aspect of the present invention, a print assembly is provided. The print assembly includes a print head having at least one chamber which selectively receives viscous material and which selectively dispenses the received viscous material. The assembly further includes at least one member which is selectively and movably disposed within the at least one chamber and which selectively removes a certain portion of the received viscous material from the at least one chamber, effective to selectively prevent the removed viscous material from being dispensed by the print head.

According to yet another aspect of the present invention, a method to prevent the undesired dispensation of received material is provided. The method is adapted for use in combination with a print head assembly which selectively receives said viscous material and which selectively dispenses said selectively received viscous material. The method includes the steps of selectively providing a void within the print head assembly, effective to store at least a portion of the received viscous material.

Other objects, features or advantages of the present invention will become apparent from the following description taken in conjunction with the accompanying drawings.

BRIEF DESCRIPTION OF THE DRAWINGS

In the course of the detailed description of certain preferred embodiments to follow, reference will be made to the attached drawings, in which.

DESCRIPTION OF CERTAIN PREFERRED EMBODIMENTS

The principles of the present invention may be applied with particular advantage to obtain an apparatus for compressing a viscous material through openings in a stencil, preferred embodiments of which may be seen at FIGS. 1, 2, 3, 4, and 5 which are described more fully below.

Figure 1:
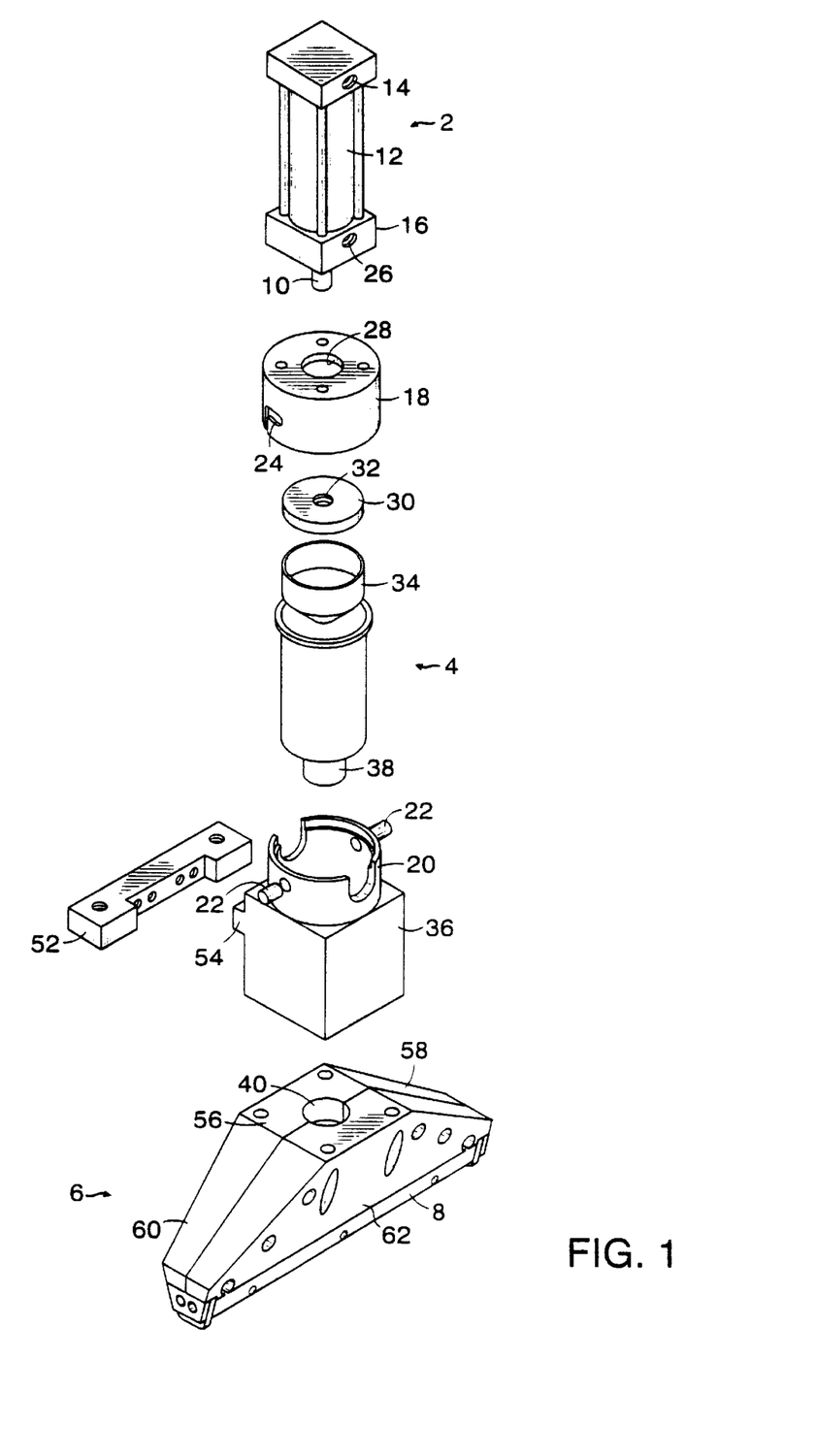
FIG. 1 is a perspective view of the apparatus of the present invention, partially exploded.

FIG. 1 is a partially exploded perspective view of one embodiment of the apparatus of the present invention. As can be generally seen at FIG. 1, the apparatus has a pressure source 2 which is operably connected to a reservoir 4 containing a supply of a viscous material, a compression head 6 and a compression head cap 8.

More particularly, FIG. 1 shows a pressure source depicted as an air cylinder 2 having a piston (not shown) connected to a rod 10 contained in a cylinder housing 12. Pressure inlet 14 allows for the introduction of air pressure at the top of air cylinder 2 thereby displacing the piston causing piston rod 10 to move downward. The air cylinder 2 is mounted via base 16 to cylinder mount 18 which in turn is removably mounted to casing 20 via a twist socket connector having posts 22 and socket grooves, one of which is shown at 24. Base 16 has air inlet 26 for the introduction of air pressure at the bottom of air cylinder 2 thereby displacing the piston causing piston rod 10 to move upward.

Piston rod 10 extends through opening 28 of cylinder mount 18 and is fixedly connected to syringe pusher 30 at contact 32 which in turn engages displacement piece 34 which is movably disposed within syringe 4 which contains a viscous material. Displacement piece 34 acts as a plunger and is designed to mate with the interior of syringe 4 to ensure effective displacement of viscous material with minimal waste. Pressure source 2 is designed to mechanically meter out viscous material through operation of the syringe pusher 30 on the displacement piece 34. The syringe pusher 30, displacement piece 34 and syringe 4 are all vertically housed in operative fashion within the cylinder mount 18, the casing 20 and the syringe housing 36.

The vertical arrangement of the pressure source 2 and the syringe 4 containing the viscous material is a preferred arrangement which advantageously provides for even and direct pressure in metering out the viscous material onto the top surface of a stencil. It is to be understood that pressure source 2 is not limited to an air cylinder of the type depicted in FIG. 1, but that other suitable pressure sources may be used by one of ordinary skill in the art based upon the teachings of the present invention.

Such pressure sources include those which mechanically, electrically, or hydraulically operate a mechanical force, such as a piston rod and displacement piece, to meter out viscous material from a syringe housing or other reservoir which contains viscous material. In addition, pneumatic pressure may be used directly to force viscous material from a reservoir housing. Also, pressure source and reservoir configurations other than the vertical configuration depicted in FIG. 1 are useful in the present invention. Such configurations include side mounted reservoirs and pressure sources or other configurations readily known to those skilled in the art.

The syringe 4 is preferably a disposable unit which can be replaced when desired by disconnecting cylinder mount 18 from casing 20 via the twist socket connector, removing the syringe and replacing it with an alternate syringe. Examples of disposable syringes useful within the teachings of the present invention include those which are readily commercially available from Methods Engineering, Vauxhall, N. J. The cartridges may be purchased prefilled with suitable viscous materials or they may be purchased empty and then filled with suitable viscous materials, such as solder pastes, which are useful within the practice of the present invention. Useful solder pastes may be readily commercially available from Alpha Metals, Jersey City, N.J..

Typical solder pastes useful with surface mount technology generally contain an alloy of tin, lead and silver in various proportions in combination with other useful solder paste metals, viscosity agents, flux and/or solvents depending upon the desired use of the solder paste. Solder pastes useful in the present invention will become apparent to one of ordinary skill in the art based upon the teachings herein.

Figure 2:
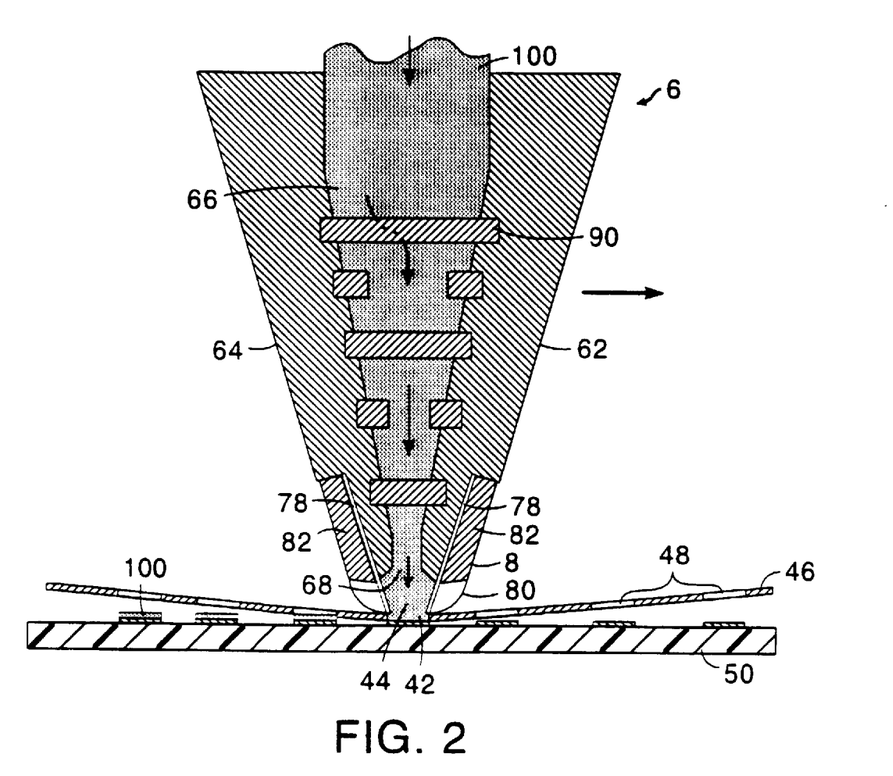
FIG. 2 is a side cross-sectional view of a compression head, a compression head cap, a stencil and a printed wiring board of the present invention showing movement of the solder paste through the compression head, the compression head cap and the openings of the stencil onto the printed wiring board.

The syringe housing 36 is mounted to a housing referred to herein as a compression head generally depicted at 6 in FIG. 1 and shown in a cross-sectional side view in FIG. 2. The syringe 4 has flange opening 38 which is inserted into and mates with first opening 40 of compression head 6 which is described hereafter with reference to both FIGS. 1 and 2 and FIG. 3 which is a bottom perspective view of the compression head cap 8, partially broken away. The compression head 6 terminates in a substantially uniform second opening 42 which is defined by compression head cap 8. The compression head cap 8 is formed from contiguous walls which define a volume 44 within compression head cap 8. The contiguous walls may be either unitary or formed from separate elements and are designed to contact stencil 46 to provide a uniform and substantially flush union with stencil 46 at the point of contact. As can be seen in FIG. 2, stencil 46 has openings 48 and is placed in an operable relationship with a printed wiring board 50. The stencil 46 may be placed in intimate contact with printed wiring board 50 or, as shown in FIG. 2, it may be placed a distance above printed wiring board 50 such that pressure from the compression head 6 forces the stencil 46 into contact with printed wiring board 50. Although stencil 46 is shown in cross-section, it is to be understood that openings 48 may have any desired orientation on stencil 46. Further openings 48 may differ in size depending upon the area of the printed wiring board 50 to be printed with the viscous material. The compression head cap 8 and stencil 46 together form a contained environment 44 for the viscous material during operation of the apparatus of the present invention.

As can be seen in FIG. 1, cross bar mount 52 is attached to syringe housing 36 via flange 54. Cross bar mount 52 is also attached to a mechanism (not shown) for horizontally displacing the apparatus of the present invention along the stencil 46.

The compression head 6 is preferably formed from metal, such as, and without limitation, iron, stainless steel, aluminum, plastic, or other material suitable for use with pressurized viscous material. The compression head 6 has top surface 56 which serves as the base to which the syringe housing 36 is attached. Side surfaces 58 and 60 extending from top surface 56 slope away from each other as depicted in FIG. 1 to define an increasing length of compression head 6. Front and back surfaces 62 and 64 are contiguous with side surfaces 58 and 60 and slope toward each other as depicted in FIG. 2 to define a decreasing width of compression head 6. The side surfaces join with the front and back surfaces to define a tapered interior chamber 66 as shown in FIG. 2 which acts to restrict flow of viscous material through compression head 6. Interior chamber 66 terminates in generally rectangular exit 68. Compression head 6 preferably acts as a nozzle to direct and constrict the flow of viscous material through generally rectangular exit 68. The compression head cap 6 defines a volume 44 surrounding the rectangular exit 68 and into which viscous material flows after exiting the interior chamber 66 of compression head 6. As shown in FIG. 2, the volume 44 is preferably a separate chamber into which the viscous material flows after exiting the interior chamber 66 via rectangular exit 68. The compression head cap 8 defines a generally rectangular opening 42 which is to be contacted with stencil 48. The compression head cap 8 acts to contain and direct the flow of viscous material to the stencil 46. In an alternate embodiment, it is to be understood that the interior chamber 66 may terminate directly into compression head cap 8 without the need for rectangular exit 68 or volume 44.

Figure 3:
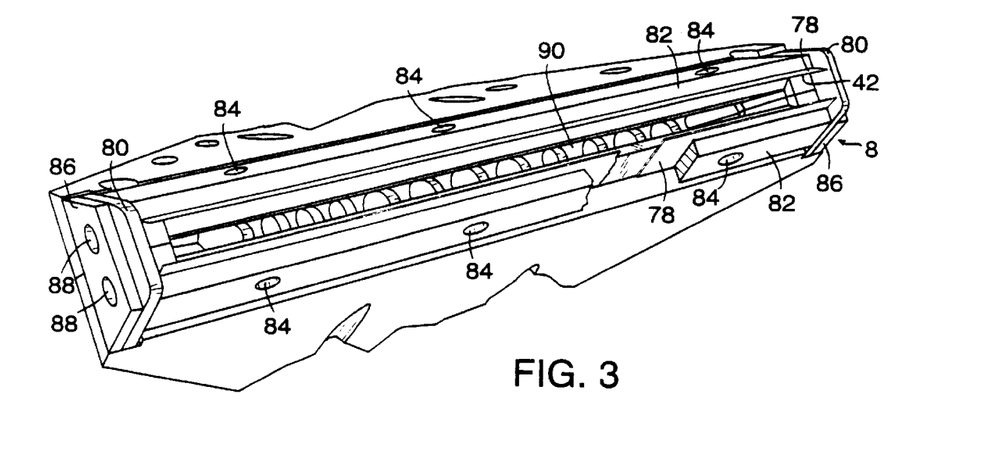
FIG. 3 is a bottom perspective view of the compression head cap of the present invention, partially broken away.
Figure 4:
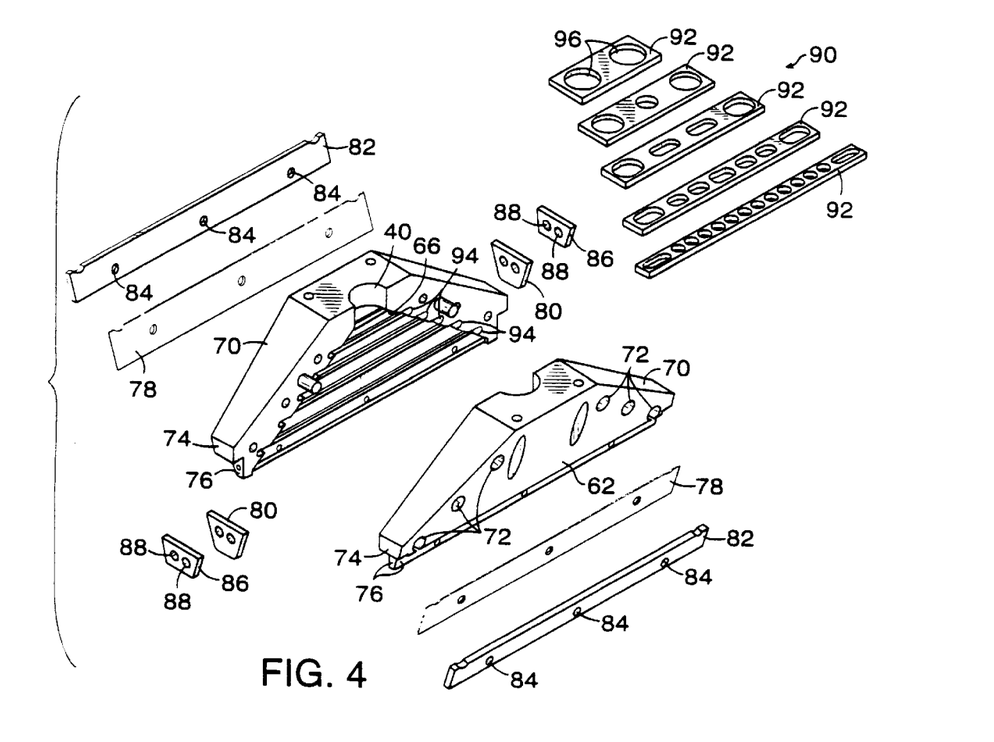
FIG. 4 is an exploded perspective view of the compression head of the present invention showing components of the compression head cap and one embodiment of a diffuser of the present invention.

As can be seen in FIG. 4, the compression head 6 has two half sections 70 which are fixedly connected by screws (not shown) via screw holes 72. The bottom side section 74 of each half section 70 is provided with ledge area 76 to engage the compression head cap 8. As depicted in FIGS. 2, 3 and 4, compression head cap 8 has rectangular blades 78 and end caps 80, which define generally rectangular opening 42. Blades 78 are each fixedly mounted to a corresponding ledge area 76 of front surface 62 and back surface 64, respectively, by means of corresponding rectangular blade holders 82 and screws (not shown) via screw holes 84. Blades 78 each extend along substantially the entire length of corresponding ledge area 76. End caps 80 are attached to a corresponding ledge area 76 of bottom side section 74 via corresponding cap mounts 86 and screws (not shown) via screw holes 88. The end caps 80 are contiguous with blades 78 and together form the compression head cap 8. As can be seen more clearly in FIG. 2, blades 78 parallel the slope of corresponding front and back surfaces 62 and 64, and are, therefore, seen to be angled inward relative to the interior chamber 66 of compression head 8.

Blades 78 are preferably thin and formed from rigid material such as iron, stainless steel, or a polymer material. End caps 80 are preferably formed from a flexible substance such as polyurethane to avoid damage to the stencil during operation of the apparatus of the present invention. Cap mounts 86 and blade holders 82 are formed from any solid material capable of securing the corresponding end cap or blade.

While the compression head cap 8 is depicted in FIGS. 2, 3, and 4 as being formed from integral parts, it is to be understood that compression head caps having a unitary structure are within the teachings of the present invention. Such unitary compression head caps are formed from a single rectangular shaped unit and are designed to encircle the ledge area 76 of the compression head 6 or otherwise operatively engage compression head 6. Such compression head caps may be either fixed or removably mounted to the compression head and may have various sizes of opening 42.

The compression head 6 and compression head cap 8, in combination with the pressure source 2 and syringe 4 advantageously provide a vertical down force to move the viscous material evenly and directly to the stencil. The compression head cap 8 of the present invention advantageously provides a contained environment to direct and to aid in the extruding of pressurized viscous material through openings in the stencil. The extruded viscous material is then deposited on the pattern of the printed wiring board. The apparatus of the present invention provides for very high speed printing capability while maintaining print definition and reduced cycle time. Waste of viscous material is minimized due to the contained environment provided by the compression head cap 8. Moreover, the rheology of the viscous material is also substantially maintained due to the minimized evaporation of the contained solvents. The length of the compression head cap 8 allows for simultaneous compression printing through a plurality of openings 48 in stencil 46. Furthermore, the trailing blade 78 relative to the direction of operation advantageously operates to shear off the viscous material contacting the stencil within the compression head cap 8 when the apparatus of the present invention is horizontally disposed across the stencil. The blades 78 are rigid and angled to advantageously achieve a smooth shearing of the viscous material. The compression head 6 and compression head cap 8 are advantageously rectangular in shape so that they may operate over a significant area of the stencil with each pass. Additionally, given the dual blade design of the compression head cap 8, the apparatus of the present invention may operate in both the forward and reverse directions thereby improving the efficiency of the compression printing process of the present invention.

As can be further seen in FIGS. 2 and 4, compression head 6 has diffuser 90 which is fixedly mounted within interior chamber 66. Diffuser 90 has a plurality of diffuser plates 92 which are horizontally disposed within interior chamber 66 via grooves 94. Each diffuser plate 92 has a series of openings 96 through which viscous material is to flow. Each opening 96 may be either circular or oblong and decreases in average size as the diffuser plates progress from the first opening 40 to the compression head cap 8. The openings. 96 also increase in number as the diffuser plates progress from the first opening 40 to the compression head cap 8. The diffuser 90 advantageously serves to break up the flow of viscous material and evenly and uniformly distribute it from side to side of the rectangular exit 42. The diffuser 90 may also serve to reduce the velocity of the viscous material flowing through the compression head and increase the static pressure of the viscous material which aids in the compression printing process.

Figure 5:
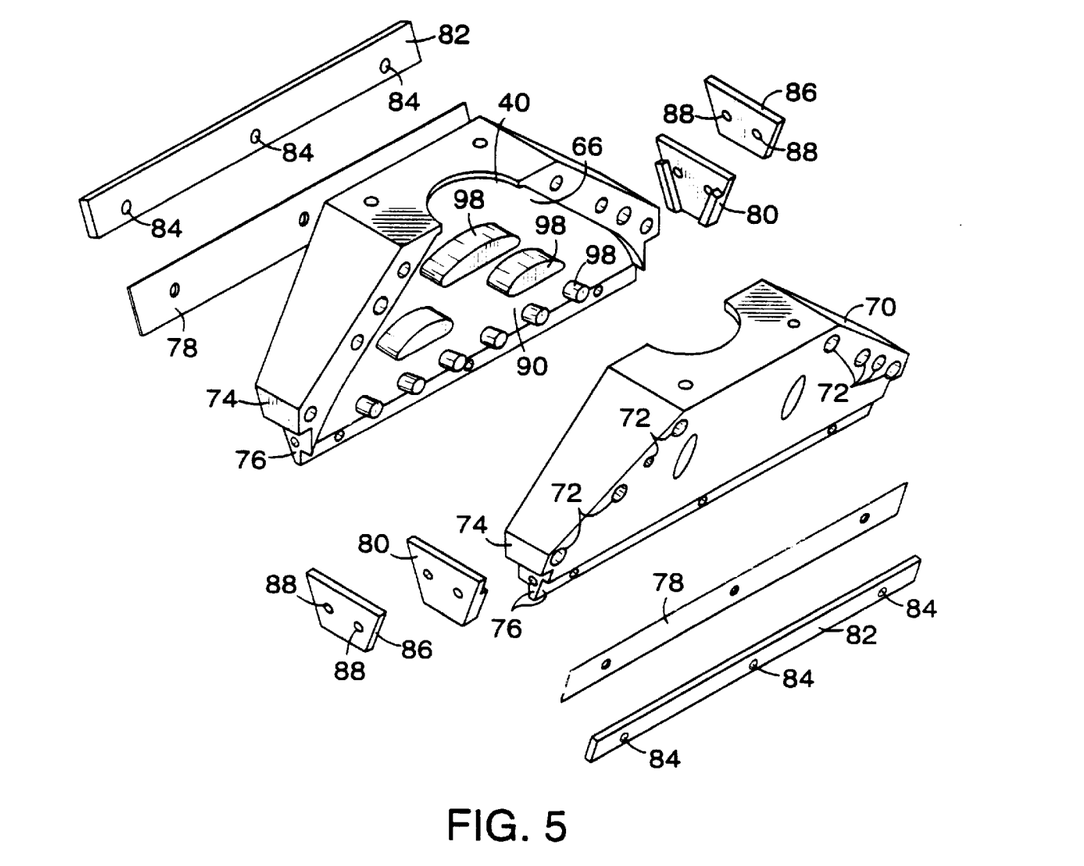
FIG. 5 is an exploded perspective view of the compression head of the present invention showing components of the compression head cap and a second embodiment of a diffuser of the present invention.
Figure 6:
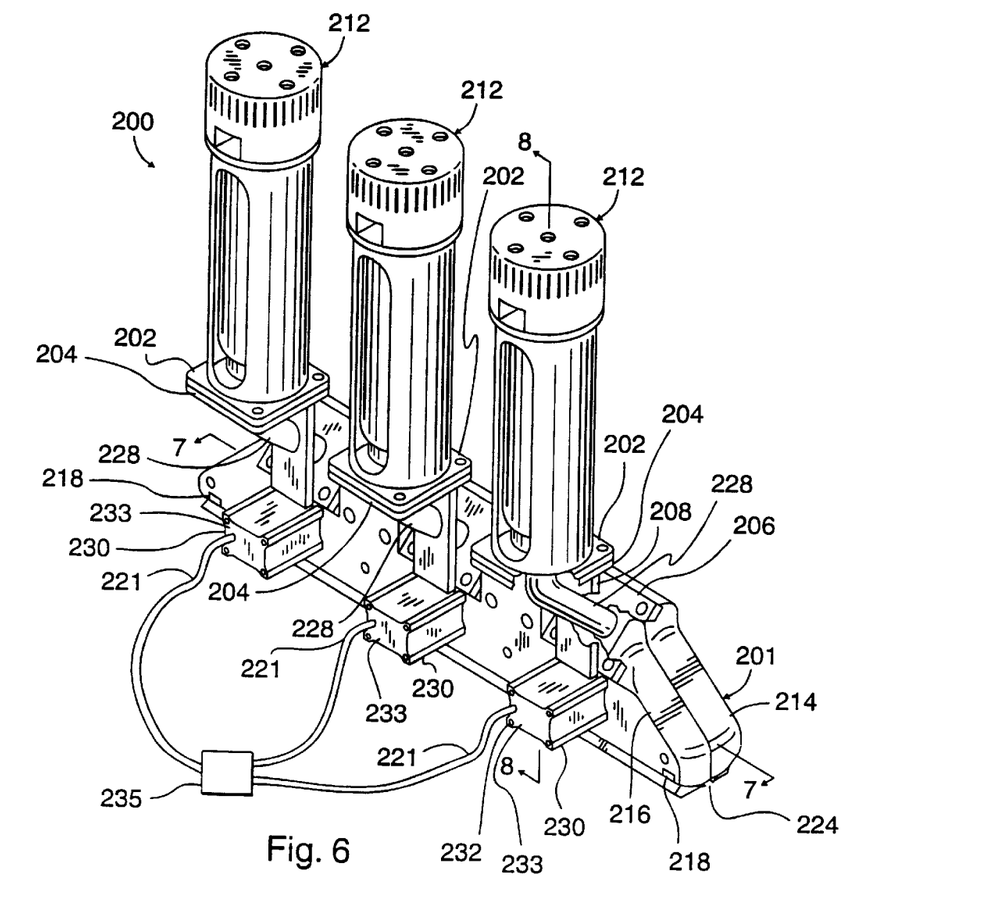
FIG. 6 is a perspective view of a compression head assembly which is made in accordance with the teachings of a second embodiment of the present invention.
Figure 7:
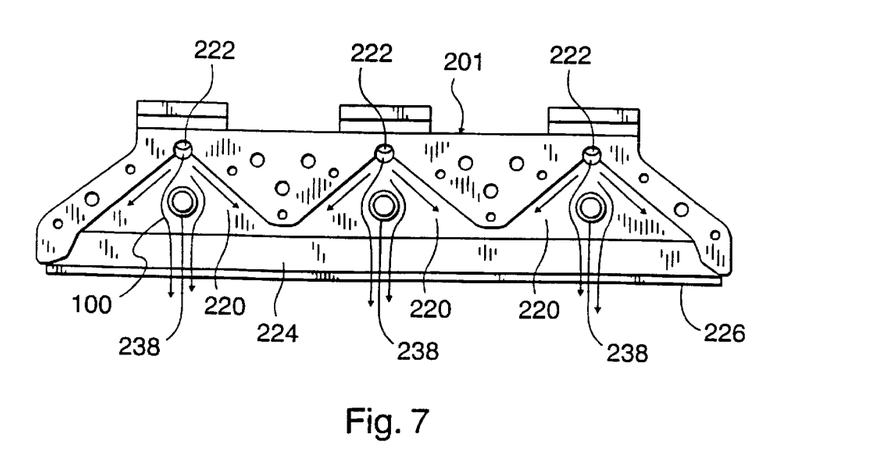
FIG. 7 is a sectional view of the assembly shown in FIG. 6 and taken along view-line 7—7.

FIG. 5 shows an alternate embodiment of a diffuser 90 useful in the present invention. The diffuser 90 has a plurality of diffuser islands 98 which are horizontally disposed in rows within interior chamber 66. The diffuser islands 98 may be fixedly installed within the interior chamber 66 or they may be molded directly within the interior chamber 66. As with the diffuser 90 of FIG. 4, each diffuser island 98 acts to break up the flow of the viscous material and uniformly and evenly distribute it from side to side of rectangular exit 42. The diffuser islands may be either circular or oblong and decrease in average size as the rows progress from the first opening 40 to the compression head cap 8. The diffuser islands 98 also increase in number as the rows progress from the first opening 40 to the compression head cap 8. The diffuser islands 98 of the present invention are advantageous in that they provide for ease of fabrication of the compression head and ease of cleaning.

Operation of the apparatus of the present invention is now described as follows with reference to FIGS. 1 and 2. When compression printing according to the teachings of the present invention, the compression head cap 8 of the apparatus of the present invention is brought into contact with the top surface of stencil 46 which forces the stencil downward until it is in intimate contact with the printed wiring board below as shown in FIG. 2. The apparatus is then moved in a horizontal direction, as shown in FIG. 2, across the stencil 46.

During movement of the stencil, pressure source 2 acts on syringe 4 to force viscous material 100 from the syringe 4 into the interior chamber 66 of compression head 6 where it is diffused by diffuser 90 and directed to rectangular exit 68. The viscous material then enters volume 44 of compression head cap 8 which provides a contained environment via blades 78 and end caps 80 to direct the pressurized viscous material under pressure to the top surface of stencil 46. The viscous material is then extruded through openings 48 in the stencil 46 over which the compression head cap 8 travels. The extruded viscous material 100 is thereby printed on the printed wiring board 50. Movement of the compression head cap 8 across the stencil surface causes the trailing blade 78 which is angled inwardly relative to the interior chamber 66 to shear off the viscous material from the top surface of stencil 46. Once the apparatus has traversed the length of the stencil, the apparatus may simply reverse its direction and continue the compression printing process since the compression head cap 8 has dual blades 78 to accomplish the shearing process in either direction of movement.

Operating variables of the apparatus of the present invention, such as run speed and pressure, may be adjusted to accommodate either viscous materials having a wide range of viscosities or stencils with holes having a wide range of diameters. The following data in Table 1 is representative of the parameters at which the apparatus has successfully operated. Print speed is measures in inches per second, air pressure is measured in pounds per square inch, viscosity of the solder paste is measured in centipoises per second, stencil apertures are measured in inches, and the particle sizes of the solder pastes used are between 10–37 microns.

TABLE 1

| Print Speed (inches/sec.) | | Air Pressure (psi) | Viscosity (cps) | | Aperture (inches) | |
| --- | --- | --- | --- | --- | --- | --- |
| Low | High | | Low | High | Low | High |
| 0.94 | 1.26 | 20 | 850K | 1.0M | 0.0055 | >0.025 |
| 1.45 | 1.70 | 20 | 850K | 1.0M | 0.0055 | >0.025 |
| 2.27 | 2.31 | 20 | 850K | 1.0M | 0.0055 | >0.025 |
| 3.10 | 3.89 | 30 | 850K | 1.0M | 0.0055 | >0.025 |
| 4.20 | 4.77 | 30 | 850K | 1.0M | 0.0055 | >0.025 |
| 5.98 | 6.62 | 40–50 | 850K | 1.0M | 0.0075 | >0.025 |
| 6.69 | 7.23 | 50–60 | 850K | 1.0M | 0.0075 | >0.025 |
| 7.70 | <12.0 | 50–60 | 850K | 1.0M | 0.0075 | >0.025 |

As indicated by the above data, the apparatus of the present invention successfully operated over a wide range of print speeds, air pressures and stencil openings. The compression printing method disclosed herein advantageously provides for quicker print speeds, better quality of printing, and less waste of solder paste material than is encountered with conventional printing methods.

While the above-delineated invention provides significant improvement over prior compression head assemblies, it does, at times, undesirably "leak" or emit viscous material even after a print stroke is completed and it is no longer receiving material. The leakage is due to the existence of residual or inertial pressure remaining within the compression head. This pressure is caused by the material which has been previously communicated to and received by the head but which has not been dispensed.

Moreover, oftentimes printing cannot desirably begin as soon as material begins to flow to the head since the material must first be received and then operatively flow within the compression head assembly in order to allow substantially uniform and desired printing to occur. This "lag time" increases production time. Moreover, this "lag time" typically varies between printing cycles and is difficult to actually measure or determine without first operating the head in order to determine whether the assembly actually produces desirable printed circuits, thereby further increasing production time and causing the creation of defective circuits which undesirably increase production costs. These drawbacks are addressed by the following additional embodiment which substantially and selectively relieves the residual pressure within the compression head at the end of a print stroke (or at any other desired time), thereby substantially eliminating the undesired leakage of the contained material. This embodiment also allows printing to desirably begin relatively faster than the previously delineated embodiment and reduces and/or substantially eliminates the creation of defective printed circuits.

Referring now to FIGS. 6–11, there is shown a second compression head assembly 200 which is adapted to selectively and substantially prevent the contained viscous material from being undesirably dispensed after a printing cycle has been completed, and which substantially decreases or eliminates the previously described material "lag time", thereby reducing production costs and production time.

Particularly, compression head assembly 200 includes a printing head 201 which is formed by the selective attachment of two substantially identical and generally elongated members 214, 216 which are each preferably manufactured from a relatively strong and substantially durable and rigid material, such as conventional and commercially available stainless steel, aluminum, plastic or a composite material. Members 214, 216 are selectively coupled by the use of several substantially identical and conventional fasteners 218, such as pins and/or screw assemblies, and may also be selectively welded or heatably joined in a conventional manner. Members 214, 216 may also be selectively molded.

As best shown in FIGS. 6–9, compression printing head 201 contains several substantially identical cavities or chamber 220. Each chamber 220 provides a separate "contained environment" within head 201 and is adapted to selectively receive and movably contain viscous material 100 which selectively emanates from a unique one of the substantially identical viscous material dispensers 212. While three chambers 220 are shown, a different number may be used in alternate embodiments of the invention. Moreover, dispensers 212 may each comprise virtually any type of assembly which selectively contains and provides a supply of viscous material to the compression head 201 at a certain and desired rate and pressure.

In one embodiment of the invention, each cavity 220 originates at a material reception aperture 222 and gradually widens and terminates within a substantially and generally elongated opening 224 which is substantially and longitudinally coextensive to the head 201 and which, in one embodiment of the invention, is substantially similar to opening 42. Head 201 also includes two substantially identical and opposed shearing blades 225, 226 which are substantially similar in function and structure as blades 78 and which are further longitudinally coextensive to the opening 224. In one non-limiting embodiment of the invention, interior surfaces 215, 217 of respective portions 214, 216 are "flared" or bevelled thereby forming substantially identical and respective angles 288, 290 with the respective blades 226, 225. Each angle 288, 290 varies, in one embodiment, from about 20° to about 80°.

Assembly 200 further includes several substantially identical brackets 202, each having substantially identical, integrally formed, aperture containing, and generally flat portions 204, 206, 208 which cooperatively and selectively support or position a unique one of the material dispensers 212 in a plane parallel to the longitudinal axis of symmetry of head 201, proximate to a unique one of the apertures 222. Particularly, each portion 204 orthogonally and integrally projects from a unique portion 208 while each portion 206 acutely and integrally projects from a unique portion 208 and is adapted to be selectively and removably secured to head 201. Further, apertures 210 of each integrally connected or formed bracket portions 204 and 208 cooperatively receive a conduit or tube 228, emanating from the respectively supported dispenser 212, and allow the tube 228 to be supportively and communicatively coupled to a unique one of the material reception apertures 222, through aperture 210 of the respective and integrally formed portion 206. In this manner, material is selectively communicated from each of the supported dispensers 212 to perspective and respective cavities 220.

Three substantially identical rod actuating assemblies 230 are selectively and fixedly mounted to the exterior of member 216 by conventional and commercially available fasteners 232. As shown, each rod actuating assembly 230 includes a housing 233 containing a conventional and commercially available pneumatic, hydraulic, mechanical or electric actuator 234 operating under external and selective control by use of a conventional electric signal control line 221 which allows control signals to be selectively provided to the contained actuator 234 from a conventional pneumatic, hydraulic, mechanical or electrical controller 235.

Figure 8:
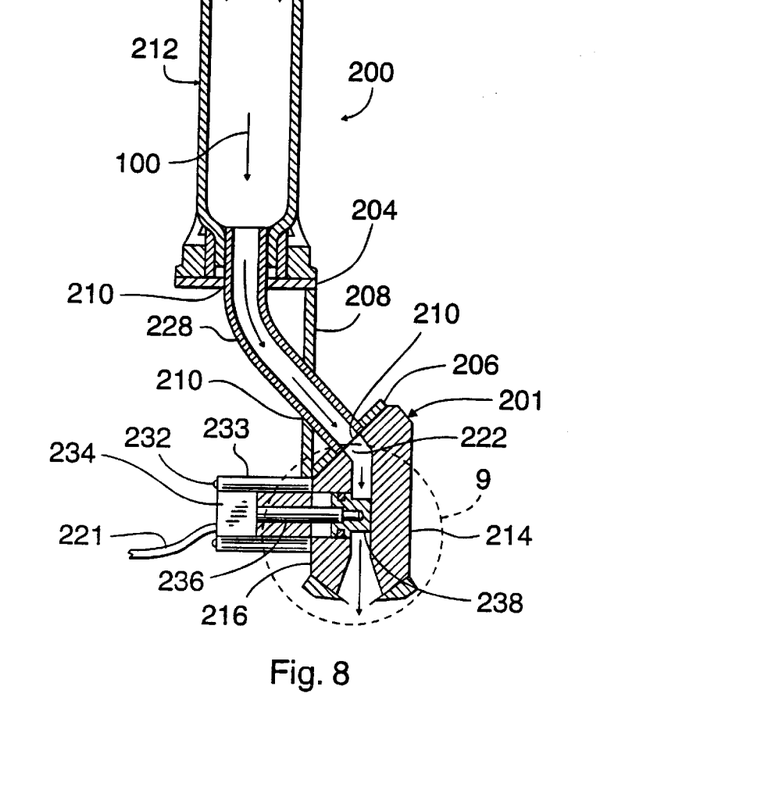
FIG. 8 is a sectional view of the assembly shown in FIG. 6, taken along view-line 8—8, and illustrating one of the displacement rods of the apparatus in a "chamber-residing" position.
Figure 9:
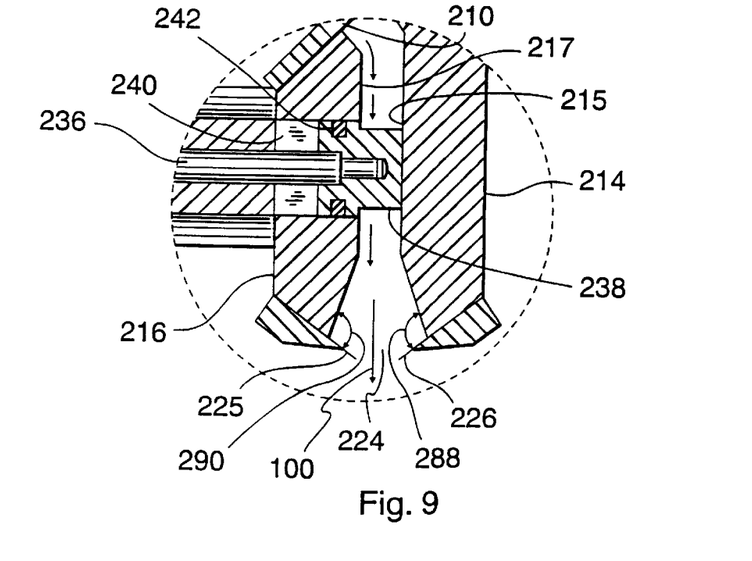
FIG. 9 is a partial view of FIG. 8 which has been enlarged.
Figure 10:
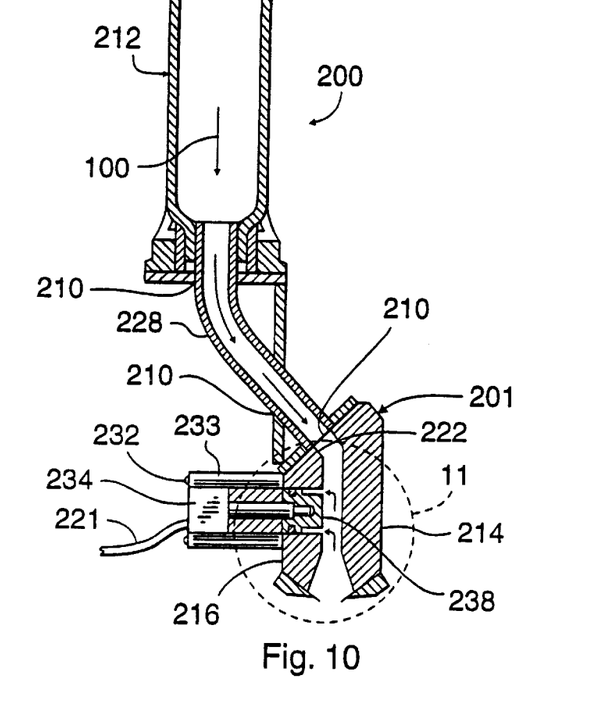
FIG. 10 is a view similar to that of FIG. 8 but illustrating the displacement rod of the apparatus selectively moved to a "chamber open" position.
Figure 11:
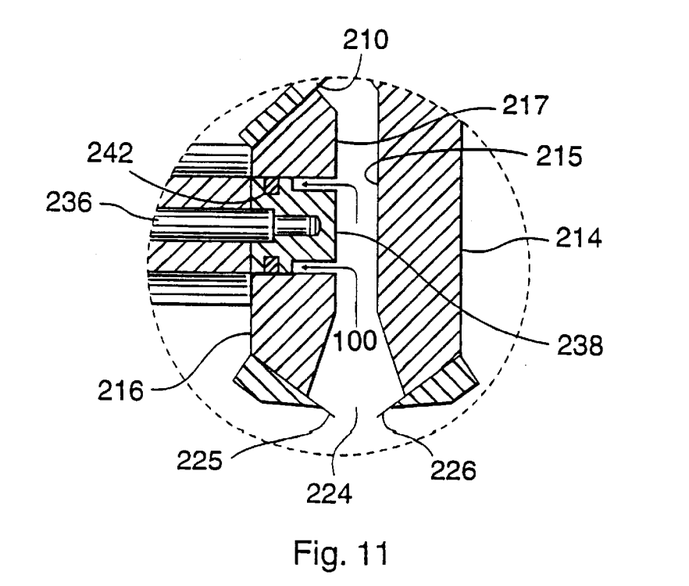
FIG. 11 is a partial view of FIG. 10 which has been enlarged.

Each actuator 234 is operatively and physically attached to a unique actuating rod 236. Each rod 236 is operatively and frictionally received within a unique one of the several substantially identical cylindrical displacement rods 238, thereby allowing the rods 238 to movably reside within head 201. Particularly, actuators 234 allow the rods 238 to be movable between an initial "chamber open" position in which the rods 238 reside within a respective and substantially circular void or opening 240 integrally formed within member 216. In this position, rods 238 do not substantially "interfere" with and/or "redirect" the flow of the viscous material 100 entering and traversing through chambers 220, as best shown in FIGS. 10 and 11. Actuators 234 also allow rods 238 to be selectively moved to a second "chamber residing" or extended position in which each of the rods 238 selectively and removably reside within a unique one of the chambers 220, substantially and directly below a unique one of the material reception apertures 222, and abutting the interior surface 215 of member 214, as best shown in FIGS. 8 and 9. Each displacement rod 238 further includes a generally round and compliant seal 242 which slidably and sealingly mates with the portion of member 216 forming a unique one of the openings 240, thereby substantially and cooperatively preventing the flow of material or paste through or into openings 240 when the rods 238 area in the second "chamber residing" position. It should be realized that each rod 238 may have a shape which selectively differs from that shown in FIGS. 8–10 and, particularly, may have, by way of example and without limitation, a generally round, triangular, or elliptical cross sectional area.

While compression head 200 has been described with respect to three material dispensers 212, it should be realized that a different number of such dispensers 212 may be employed by head 200, and that this invention is not limited by or to a particular number or type of dispensers 212. Furthermore, other modifications may be made to head 200, such as the use of a different number, type, size or location of displacement rods 238.

In operation, at the beginning of a print stroke, compression head 200 is placed upon the top surface of a stencil, such as stencil 46 (see FIG. 2), thereby compressibly forcing the stencil against the printed wiring board. Dispensers 212 selectively and cooperatively force the respectively contained viscous material 100 through tubes 228 and apertures 222 and into chambers 220. The received viscous material 100 flows through the chambers 220, at a certain speed and pressure, before being exiting the assembly 200 through the elongated aperture 224, thereby being selectively and desirably deposited upon the stencil 46. The dispensed material 100 also sealingly forces blades 225, 226 against the stencil 46. This sealing engagement is enhanced, aided, or assisted by the angular placement of the blades 225, 226 with respect to interior surfaces 217, 215. A print stroke is completed-when the stencil 46 has been desirably provided with deposited material 100.

Just prior to the initiation of the print stroke and just after material begins to flow from the dispensers 212 into the head 201, actuators 234 are selectively energized effective to cooperatively force the actuating rods 236 to cooperatively move the displacement rods 238 from their respective initial positions within respective openings 240 (FIGS. 10 and 11), to their respective fully extended "chamber residing" position (FIGS. 8 and 9). The movement of the displacement rods 238 reduces the volume of the chambers 220 and is effective to increase the pressure and the speed of the material 100 flowing through the chambers 220, thereby allowing the material 100 to be relatively quickly deposited upon the stencil 46 and further allowing a print stroke to be quickly and efficiently completed.

Furthermore, the foregoing selective movement of rods 238 substantially eliminates any "voids" or air pockets that may be present within the contained viscous material 100, thereby ensuring a substantially complete and uniform placement of the material upon the stencil 46. Selectively extended rods 238 also desirably and cooperatively disrupts or "agitates" the flow of the viscous material 100, thereby allowing the material 100 to be substantially, uniformly, and evenly distributed upon the stencil 46. In this manner, the very first print stroke of compression head 200 provides substantially the same uniform quality as that provided by subsequent printing strokes, thereby substantially preventing the undesirable creation of defective circuits.

The compression head 200 is moved horizontally across the stencil and wiring board until it reaches the end of the print stroke. At the completion of the print stroke, the flow of pressurized viscous material 100 from dispensers 212 is stopped and, at substantially the same time, actuators 234 cooperatively and selectively retract displacement rods 238 back into their respective initial position. This substantially contemporaneous and cooperative retraction of rods 238 creates a respective expansion volume or void by allowing a portion of each opening 240 to communicate with a respective and unique chamber 220, thereby cooperatively "sucking" or drawing viscous material 100, which is contained within head 201, into the chamber communicating portions of openings 240, thereby substantially relieving any residual pressure in the compression head and substantially eliminating any leakage of viscous material 100 after the printing stroke has been completed. The material may be temporarily stored within the openings 240.

This temporarily "stored material" also reduces and/or eliminates the printing "lag time". That is, since the stored material resides within the chamber communicating openings 240, it may be readily communicated and transferred to the opening 224 by the actuation of rods 238 during the beginning of the next print stroke, thereby allowing printing to be desirably begin before the material 100 is actually communicated to the chambers 220 by dispensers 212, effective to reduce production time, eliminate/reduce the "lag time", and prevent the creation of defective circuits.

It is to be understood that the invention is not limited to the exact construction and method illustrated but that various changes may be made without departing from the spirit and the scope of the invention as delineated in the following claims.

What is claimed is:

1. A print assembly for use in combination with viscous material, said print assembly comprising:

a print head having at least one chamber which selectively receives said viscous material and which selectively allows said received viscous material to be selectively dispensed from said print head; and at least one member which is selectively and movably disposed within said at least one chamber and which selectively removes a certain portion of said received viscous material from said at least one chamber, effective to selectively prevent said removed viscous material from being dispensed by said print head;

wherein said chamber is formed by at least two walls, said print assembly further including a blade which is coupled to one of said two walls and which forms an angle with said one of said two walls of about from about 20 to about 80 degrees.

* * * * *